(12) United States Patent
Cousins

(10) Patent No.: US 7,718,888 B2
(45) Date of Patent: May 18, 2010

(54) SOLAR CELL HAVING POLYMER HETEROJUNCTION CONTACTS

(75) Inventor: Peter John Cousins, Muntinlupa (PH)

(73) Assignee: SunPower Corporation, San Jose, CA (US)

( * ) Notice: Subject to any disclaimer, the term of this patent is extended or adjusted under 35 U.S.C. 154(b) by 939 days.

(21) Appl. No.: 11/306,510

(22) Filed: Dec. 30, 2005

(65) Prior Publication Data

US 2007/0151599 A1    Jul. 5, 2007

(51) Int. Cl.
*H01L 25/00* (2006.01)

(52) U.S. Cl. ............ 136/243; 136/255; 136/256; 136/263; 257/40; 438/98

(58) Field of Classification Search ......... 136/243, 136/255, 256, 263; 257/40; 438/98
See application file for complete search history.

(56) References Cited

U.S. PATENT DOCUMENTS

| | | | |
|---|---|---|---|
| 4,104,091 A * | 8/1978 | Evans et al. ............ 438/57 |
| 4,234,352 A | 11/1980 | Swanson | |
| 4,478,879 A | 10/1984 | Baraona et al. | |
| 4,554,335 A * | 11/1985 | Sakagami et al. ....... 526/249 |
| 4,667,060 A * | 5/1987 | Spitzer ................ 136/255 |
| 4,927,770 A | 5/1990 | Swanson | |
| 5,053,083 A | 10/1991 | Sinton | |
| 5,125,984 A * | 6/1992 | Kruehler et al. ........ 136/255 |
| 5,262,633 A * | 11/1993 | Kasai et al. ........... 250/208.1 |
| 5,797,998 A * | 8/1998 | Wenham et al. ......... 136/255 |
| 6,872,321 B2 | 3/2005 | Thavarajah et al. | |
| 7,268,363 B2 * | 9/2007 | Lenhard et al. ......... 257/40 |
| 2004/0200520 A1 * | 10/2004 | Mulligan et al. ........ 136/256 |
| 2006/0025311 A1 * | 2/2006 | Brabec et al. ........... 505/460 |

OTHER PUBLICATIONS

Sinton et al., "27.5-Percent Silicon Concentrator Solar Cells," IEEE Electronic Device Letters, vol. EDL-7, No. 10, Oct. 1986, pp. 567-569.
Verlinden et al., "High Efficiency Interdigitated Back Contact Silicon Solar Cells," Proc. 19th IEEE Photovolt. Solar Energy Conf., New Orleans, LA, May 1987, pp. 405-410.
Sinton et al., "Simplified Backside-Contact Solar Cells," IEEE Transactions on Electron Devices, vol. 37, No. 2, Feb. 1990, pp. 348-352.

(Continued)

*Primary Examiner*—Alexa D Neckel
*Assistant Examiner*—Xiuyu Tai
(74) *Attorney, Agent, or Firm*—Okamoto & Benedicto LLP

(57) ABSTRACT

A solar cell having backside contacts is economically fabricated through use of acceptor and donor polymers which are inkjet printed in interleaved patterns on the back surface as the carrier accepting electrodes of the solar cell. The polymers can be placed on a tunnel oxide on the surface of a semiconductor substrate, or the polymers can be in direct contact with the semiconductor substrate. Electrical patterns interconnecting the acceptor and donor polymer patterns can also be formed by inkjet printing a seed layer and then electroplating the seed layer. Advantageously, high temperature processing is not required in the process as is required in conventional solar cell fabrication using dopant implants into the semiconductor substrate. In alternative embodiments, doped contacts are diffused in the top surface and a polymer contact is formed over the back surface.

28 Claims, 6 Drawing Sheets

OTHER PUBLICATIONS

Gee et al., "Emitter Wrap-Through Solar Cell," 23rd IEEE Photo. Spec. Conf., 1993, pp. 265-270.

Verlinden et al., "High Efficiency Silicon Point-Contact Solar Cells for Concentrator and High Value One-Sun Applications," 12th European Photovoltiac Solar Energy Conference, Amsterdam, The Netherlands, Apr. 11-15, 1994, pp. 1477-1480.

Gee et al., "Progress on the Emitter Wrap-Through Silicon Solar Cell," 12th European Photovoltiac Solar Energy Conference, Amsterdam, The Netherlands, Apr. 11-15, 1994, pp. 743-746.

Schönecker et al., "An Industrial Multi-Crystalline EWT Solar Cell with Screen Printed Metallisation," 14th European Photovoltiac Solar Energy Conference, Barcelona, Spain, Jun. 30-Jul. 4, 1997, pp. 796-799.

Meier et al., "Self-Doping Contacts and Associated Silicon Solar Cell Structures," 2nd World Conference and Exhibition on Photovoltaic Solar Energy Conversion, Vienna, Austria, Jul. 6-10, 1998, pp. 1491-1494.

Faika et al., "Simplification of EWT (Emitter Wrap-Through) Solar Cell Fabrication Using AL-P-Codiffusion," Proc. 28th IEEE Photovoltiac Specialists Conf., 2000, pp. 260-263.

Van Kerschaver et al., "Towards Back Contact Silicon Solar Cells with Screen Printed Metallisation," Proc. 28th IEEE Photovoltiac Specialists Conf., 2000, pp. 209-212.

Kress et al., "10×10 $cm^2$ Screen Printed Back Contact Cell with a Selective Emitter," Proc. 28th IEEE Photovoltiac Specialists Conf., 2000, pp. 213-216.

Shaheen et al., "Polymer Based Nanostructure Donor-Acceptor Heterojunction Photovoltaic Devices," NCPV and Solar Program Review Meeting 2003, p. 438-441.

Wu et al, "Theory of photoinduced charge transfer in weakly coupled donor-acceptor conjugated polymers: application to an MEH-PPV:CN-PPV pair," Chem. Phys. 227, 11 (1998).

Brust, Gregory, "Polymides," http://www.plsc.ws.macrog/imide.htm, downloaded on Dec. 16, 2005, 4 pages.

Yasuda et al., "New Coplanar (ABA)n-Type Donor-Acceptor-Conjugated Copolymers Constituted of Alkylthiophene (Unit A) and Pyridazine (Unit B): Synthesis Using Hexamethylditin, Self-Organized Solid Structure, and Optical and Electrochemical Properties of the Copolymers," Chem. Mater., 17 (24), 6060-6068, 2005.

* cited by examiner

SOLAR CELL HAVING POLYMER HETEROJUNCTION CONTACTS

BACKGROUND OF THE INVENTION

This invention relates generally to photovoltaic solar cells, and more particularly the invention relates to a solar cell structure which is efficient in operation and economical to manufacture.

The use of photovoltaic cells for the direct conversion of solar radiation into electrical energy is well known, see Swanson, U.S. Pat. No. 4,234,352 for example. Briefly, the photovoltaic cell comprises a substrate of semiconductive material having a p-n junction defined therein. In the planar silicon cell the p-n junction is formed near a surface of the substrate which receives impinging radiation. Radiated photons create mobile carriers (holes and electrons) and the substrate which can be directed to an electrical circuit outside of the cell. Only photons having at least a minimum energy level (e.g., 1.1 electron volt for silicon) can generate an electron-hole pair in the semiconductor pair. Photons having less energy are either not absorbed or are absorbed as heat, and the excess energy of photons having more than 1.1 electron volt energy (e.g. photons have a wavelength of 1.1 µm and less) create heat. These and other losses limit the efficiency of silicon photovoltaic cells in directly converting solar energy to electricity to less than 30%.

Solar cells with interdigitated contacts of opposite polarity on the back surface of the cell are known and have numerous advantages over conventional solar cells with front side metal grids and blanket or grid metallized backside contacts, including improved photo-generation due to elimination of front grid shading, much reduced grid series resistance, and improved "blue" photo-response since heavy front surface doping is not required to minimize front contact resistance because there are no front contacts. In addition to the performance advantages, the back-contact cell structure allows simplified module assembly due to coplanar contacts. See Swanson U.S. Pat. No. 4,927,770 for example.

While interdigitated back-contact (IBC) solar cells have been fabricated, cost considerations have limited commercialization of the IBC solar cell. Heretofore, conventional microelectronics (integrated circuit) processing has been employed in fabricating IBC solar cells, including the use of backside diffusions, contacts, and metal lines fabricated by conventional microelectronics photolithography, thin film metallization, and etching processes. This fabrication process is capable of producing high efficiency solar cells, but the process is not cost effective for application in conventional low-cost, flat-plate solar panels. The key problem with practical realization of an IBC solar cell by this process is the high cost of fabrication, including etching, doping and mask alignment, and the use of thick metal conductor deposition by vacuum evaporation or sputtering. Further, the processing must be carried out in a clean room environment. Thus IBC solar cells fabricated using these methods have been restricted to application in high concentration solar cells or in very high value one-sun applications.

Polymers are known which can provide electrons and holes when stimulated by radiation. In a pair of coupled donor-acceptor conjugated polymer chains, it is possible for an exciton photo-excited on either polymer to decay and to a hole in the donor polymer surveillance band and an electron in the conduction band of the acceptor polymer. See Wu et al. "Theory of Photo-induced Charge Transfer in Weakly Coupled Donor-Acceptor Conjugated Polymers" Chem. Phys. 227,11 (1998). Bulk photovoltaic have been fabricated using blends of conjugated polymers. See for example Shaheen et al. "Polymer Based Nanostructure Donor-Acceptor Heterojunction Photovoltaic Devices," NCPC and Solar Program Review Meeting 2003.

The present invention utilizes donor and acceptor polymers in a semiconductor base solar cell to provide a cost effective back contact solar cell.

SUMMARY OF THE INVENTION

The invention combines a semiconductor substrate with acceptor and donor polymer contacts to provide a solar cell which is economically fabricated.

In one embodiment, a silicon substrate has a radiation receiving front surface and photo-generation polymer contacts on a back surface forming heterojunctions which attract electrons and holes in the silicon substrate produced by radiated photons. The polymer contacts include donor and acceptor copolymers which can be arranged for efficient carrier transfer. Preferably, a thin tunnel oxide is formed on the back surface of the substrate and then the polymer material is applied on the tunnel oxide by inkjet printing. Photo-generated carriers then tunnel through the oxide to the polymer acceptor and donor contacts. In other embodiments, the tunnel oxide is removed under the contacts with the polymer contacts directly abutting the silicon substrate. The oxide can be retained between contacts as a surface passivation layer on the back surface along with a layer of dielectric polymer. By placing the polymer contacts on the back surface, degradation of the polymer due to impinging ultraviolet radiation is reduced.

In another embodiment, one non-polymer contact array is placed on the front surface and a polymer array is placed on the back surface. Electrons and holes then migrate to the contacts on opposing surfaces.

Importantly, fabrication of a solar cell, in accordance with the invention, is improved in cost and in reduced temperature cycling through use of inkjet application of the polymer contacts without the need for photoresist masking, etching, and dopant diffusion and annealing as is required in prior art solar cells.

The invention and objects and features thereof will be more readily apparent from the following detailed description and appended claims when taken with the drawings.

DETAILED DESCRIPTION

In accordance with one embodiment of the invention, a solar cell comprising a silicon semiconductor body having first and second opposing major surfaces receives radiation through the first surface and has first and second patterns of acceptor polymer and donor polymer, respectively, on the second or back surface for receiving electron and hole carriers created in the silicon substrate by radiated photons. The structure is similar to prior art back contact solar cells which utilize doped P and N conductivity contacts for receiving the holes and electrons created by radiation. However, the use doped P and N contacts in the photocell requires photoresist masking, etching, dopant diffusion, and high temperature processing in the fabrication of the solar cell. The use of acceptor and donor polymers in the structure, in accordance with an embodiment of the invention, obviates the need for photoresist masking and etching and the high temperature processing required in annealing the diffused dopants. Further, the resulting heterojunctions of the polymers with the substrate improve performance by eliminating Auger Recombination.

Further, by placing the polymers on the back surface of the solar cell, the polymers are shielded from some ultraviolet radiation which is received by the front surface of the cell. In an alternative embodiment of the invention, doped P or N regions are formed in the top surface, which can endure ultraviolet radiation, while either a donor or acceptor polymer contact is provided on the back surface. The hole and electron carriers then migrate to opposing surfaces of the solar cell, in accordance with prior art devices, but the back surface does have a polymer contact which is readily fabricated and again is shielded from UV radiation.

Figure 1A:
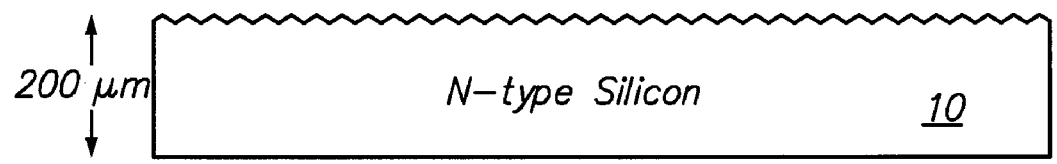
FIGS. 1A-1F are section views of a silicon wafer illustrating steps in fabricating a solar or photovoltaic cell in accordance with one embodiment of the invention.

FIGS. 1A-1E are section views of a silicon substrate illustrating steps in fabricating a backside contact solar cell in accordance with an embodiment of the invention. In FIG. 1A, a lightly N doped silicon substrate 10 has a resistance on the order of 5 ohm-centimeter and a thickness on the order of 200 microns. The top surface of substrate 10 is textured by chemical (e.g., anisotropic etching) or physical abrasion as in the prior art to provide a radiation capturing surface for the substrate. The back surface of substrate 10 is etched and polished on which acceptor and donor polymer contacts will be formed.

Figure 1B:
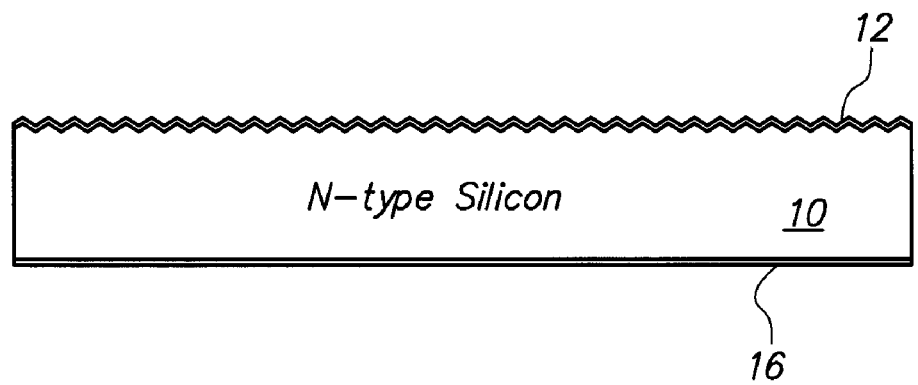

In FIG. 1B, a thin coating of silicon oxide 12 and 16 is grown, preferably using conventional ozone (O3) atmosphere, on both the textured surface and the polished surface. Oxide layer 16 will be used as a tunnel oxide and has a thickness on the order of ten Angstroms. After the desired thickness is grown, the oxide is annealed in a hydrogen atmosphere using rapid thermal annealing, for example. The annealing promotes excellent surface passivation and bulk passivation of the oxide layer.

Figure 1C:
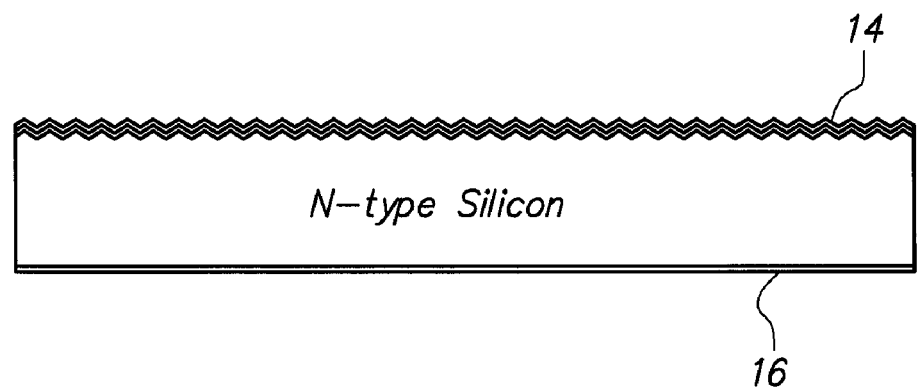

Thereafter, an antireflective coating such as silicon nitride or doped silicon carbide 14 can be deposited on the silicon oxide layer 12 to further enhance the anti-reflection surface as shown in FIG. 1C.

Figure 1D:
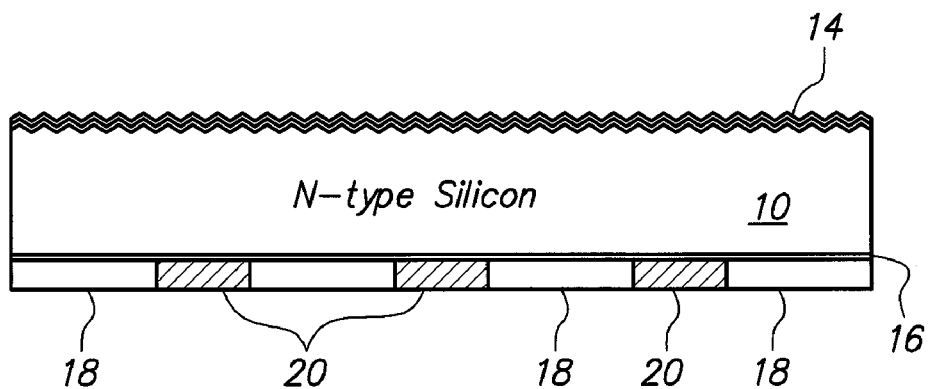
Figure 1E:
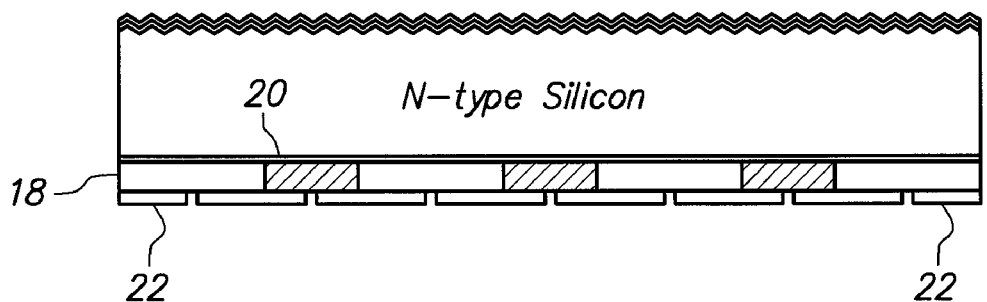

Next, as shown in FIG. 1D, a first pattern of acceptor polymer 18 is applied over tunnel oxide 16 through use of inkjet printing, and a second pattern of donor polymer 20 is formed over oxide layer 16 and interleaved with the first pattern 18. The two patterns can abut. A dielectric polymer 22 is then applied by inkjet printing over the polymer layers 18 and 20 as shown in FIG. 1E to form a moisture barrier. The inkjet application of the polymers is similar to the use of inkjet for three tone printing on paper. The polymers used in the printing are commercially available from Sigma-Aldrich, for example. Alternatively, an inorganic, $SiN_X$ or SiC, can be deposited on the rear surface as a moisture barrier.

Figure 1F:
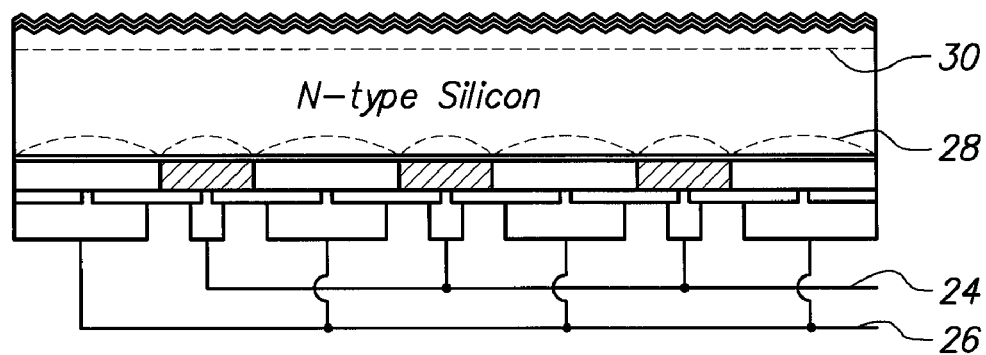

After the polymers are applied on the backside and vias are opened to polymers 18, 20, a metal interconnect pattern is formed as shown in FIG. 1F with all of the donor polymers 20 interconnected at 24, and all of the acceptor polymers 18 interconnected at 26. Connectors 24, 26 are formed by first sputtering a seed layer of a conductive metal such as aluminum or copper and then pattern plating the seed metal to increase thickness. Alternatively, the seed layer can be applied by inkjet as is the polymer material.

The tunnel junction 28 is shown by dotted line above the donor and acceptor polymers. The electrical carriers generated in the silicon wafer by impinging radiation then tunnel through oxide 16 to or from the polymer contacts. A similar induced junction field 30 is formed in the substrate under the top textured surface.

In alternative embodiments, the tunnel oxide can be removed from under the polymer contact with each contact directly abutting the surface of substrate 10. Further, solar cells are known in which one dopant contact is in the top surface, and an opposite conductivity contact is on the second surface. Such a solar cell can employ the present invention by using doped regions in the top surface which are less susceptible to UV radiation, and then forming an opposite conductivity polymer contact in the back surface, either donor or acceptor. Again, the polymer contact on the back surface will be shielded from some of the impinging UV radiation.

Figure 2A:
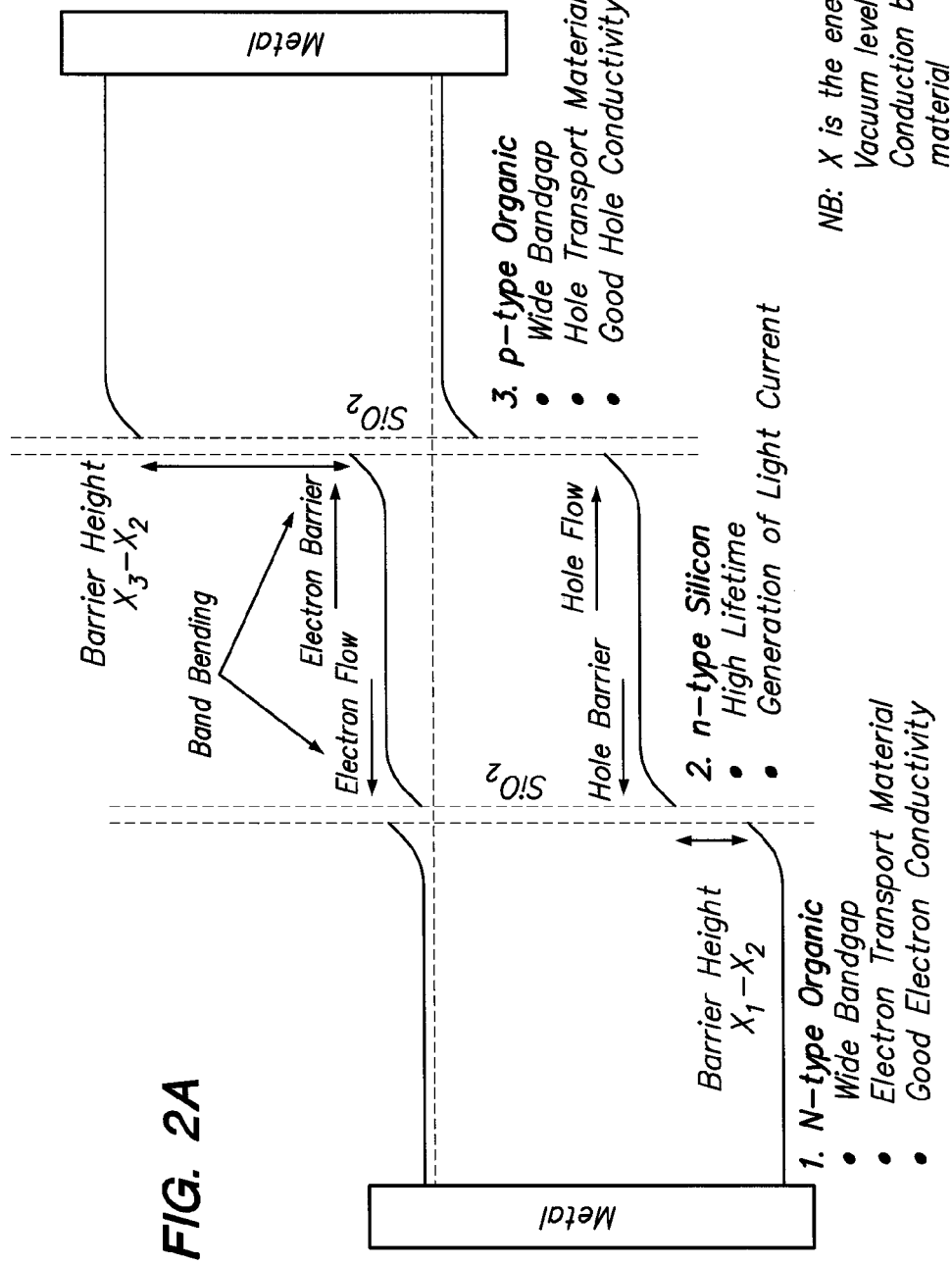
FIG. 2A-2C are band-gap diagrams for a solar cell having back surface polymer contacts, a solar cell having n-doped contacts on a front surface, and a solar cell having p-doped contacts on a front surface, respectively.
Figure 2B:
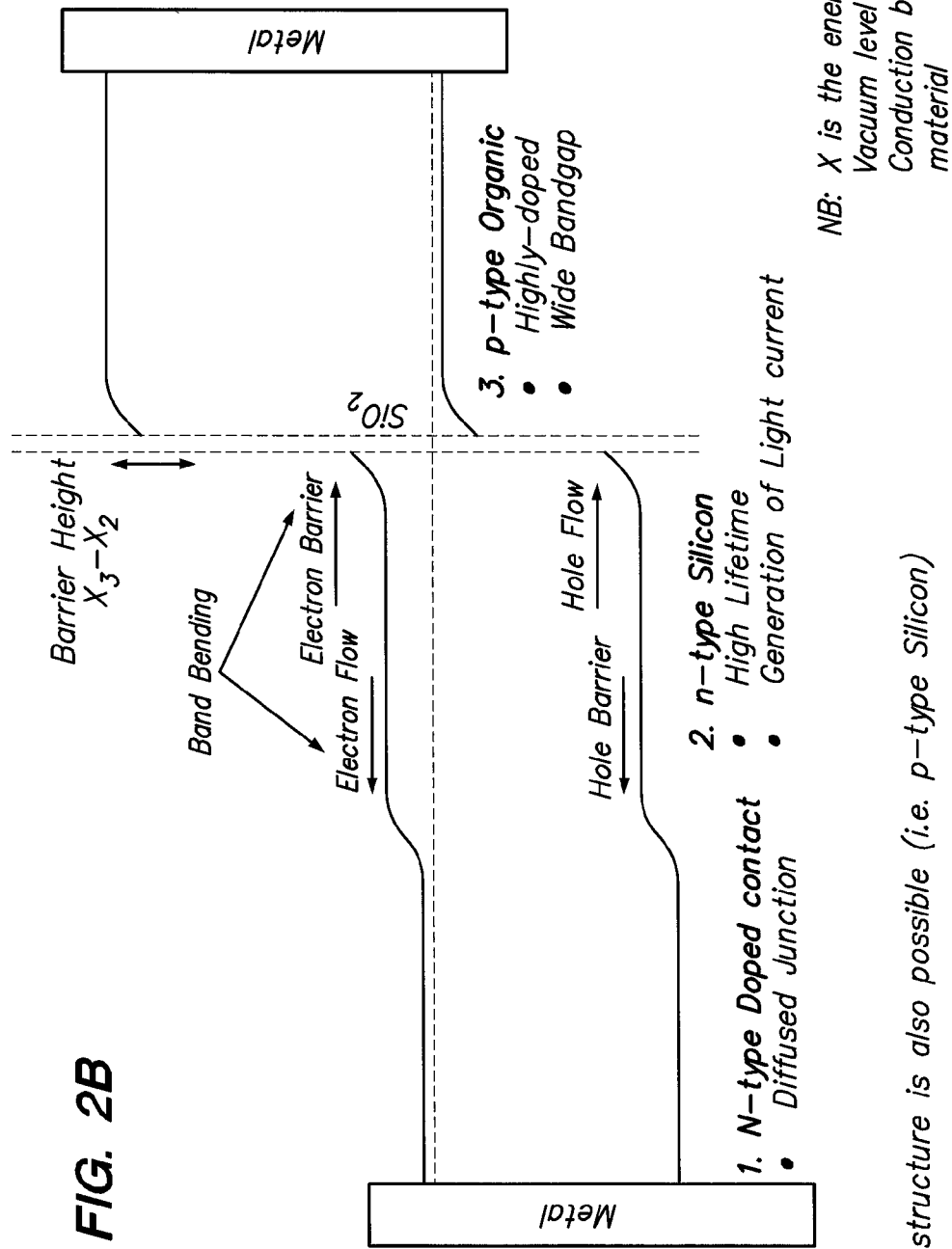
Figure 2C:
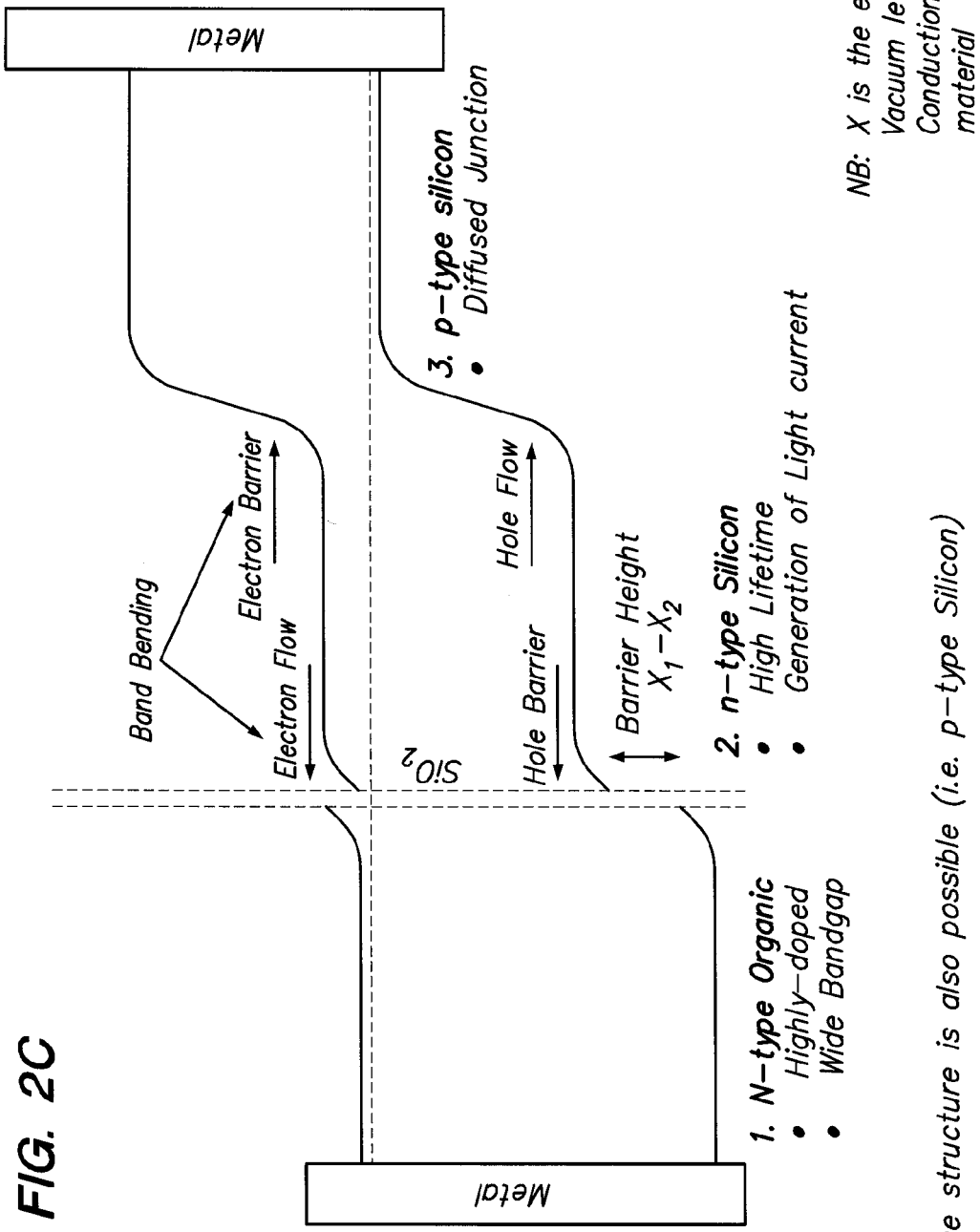
Figure 3A:
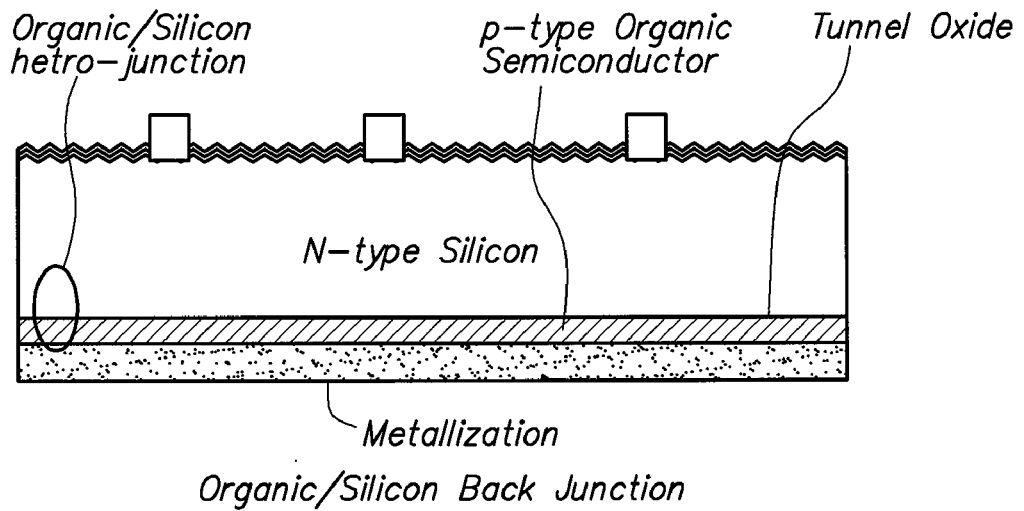
FIGS. 3A-3B are section view of alternative embodiments of a solar cell having n-doped contacts on a front surface and a solar cell having p-doped contacts on a front surface.
Figure 3B:
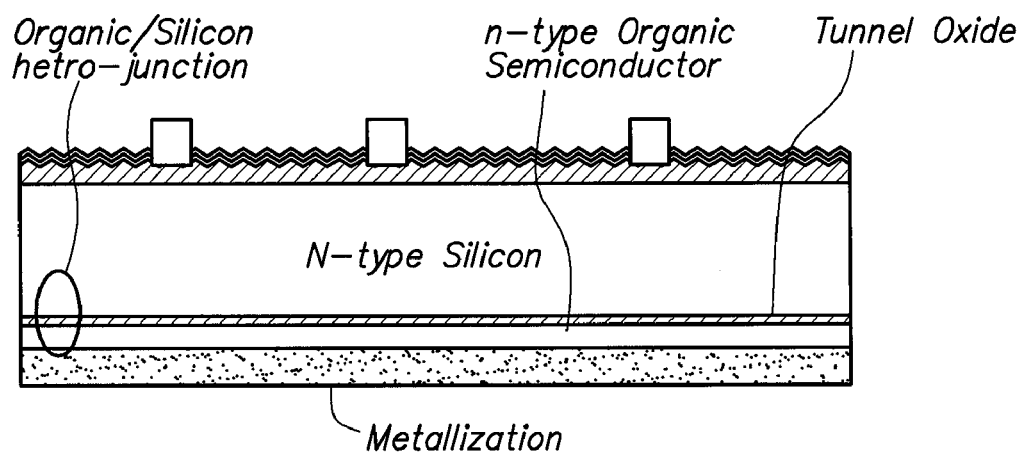

FIGS. 2A-2C are band-gap diagrams for a solar cell having back surface polymer contacts forming heterojunction with the substrate (See FIG. 1F), a solar cell having n-doped contacts in the front surface and an acceptor (p-type) polymer back contact (See FIG. 3A), and a solar cell having p-doped contacts in the front surface and a donor polymer (n-doped) polymer back contact (See FIG. 3B).

The invention permits added improvements in manufacturing cost and eliminates deleterious processing by using polymers that can be applied by inkjet printing. Photoresist masking, etching, doping, and annealing steps are then obviated, and the use of inkjet printing accelerates the application of the polymer contacts.

While the invention has been described with reference to specific embodiments, the description is illustrative of the invention and is not to be construed as limiting the invention. For example, a p-doped silicon substrate can be used rather than the described n-doped silicon substrate. Thus, various applications may occur to those skilled in the art without departing from the spirit and scope of the invention as defined by the appended claims.

What is claimed is:

1. A solar cell comprising:
   a) an inorganic semiconductor body having a first surface on a light-receiving side and a second opposing surface on a device side;
   b) a first dielectric layer on the first surface and a second tunneling dielectric layer on the second surface;
   c) a first pattern of acceptor polymer over the second surface, and a second pattern of donor polymer over the second surface and interleaved with the first pattern of acceptor polymer; and
   d) a first conductive pattern electrically connected to the acceptor polymer, and a second conductive pattern electrically connected to the donor polymer.

2. The solar cell as defined by claim 1 and further including a dielectric polymer over the acceptor polymer and the donor polymer on the second surface.

3. The solar cell as defined by claim 2 wherein the acceptor polymer and the donor polymer are spaced from the second surface by the second dielectric layer.

4. The solar cell as defined by claim 3 wherein the second dielectric layer comprises a layer of tunnel oxide.

5. The solar cell as defined by claim 4 wherein the semiconductor body comprises silicon and the layer of tunnel oxide comprises silicon oxide.

6. The solar cell as defined by claim 5 wherein the first and second conductive patterns are selected from the group consisting of aluminum and copper.

7. The solar cell as defined by claim 6 wherein the first pattern of acceptor polymer, the second pattern of donor polymer, and the dielectric polymer are inkjet printed on the second surface.

8. The solar cell as defined by claim 7 wherein the first conductive pattern and the second conductive pattern are inkjet printed.

9. The solar cell as defined by claim 8 wherein the first dielectric layer comprises silicon oxide.

10. The solar cell as defined by claim 9 and further including a layer of doped silicon carbide over the first dielectric layer.

11. The solar cell as defined by claim 2 wherein the acceptor polymer and the donor polymer are in contact with the second surface.

12. The solar cell as defined by claim 11 wherein the semiconductor body comprises silicon.

13. The solar cell as defined by claim 12 wherein the first and second conductive patterns are selected from the group consisting of aluminum and copper.

14. The solar cell as defined by claim 13 wherein the first pattern of acceptor polymer, the second pattern of donor polymer, and the dielectric polymer are inkjet printed on the second surface.

15. The solar cell as defined by claim 14 wherein the first conductive pattern and the second conductive pattern are inkjet printed.

16. The solar cell as defined by claim 15 wherein the first dielectric layer comprises silicon oxide.

17. The solar cell as defined by claim 16 and further including a layer of doped silicon carbide over the first dielectric layer.

18. The solar cell as defined by claim 1 wherein the first surface is textured.

19. A solar cell comprising:
   a) an inorganic semiconductor body having first and second opposing major surfaces, wherein the first surface is on a light-receiving side, and the second surface is on a device side;
   b) a first dielectric layer on the first surface and a second dielectric layer on the second surface, wherein the second dielectric layer is a tunneling dielectric layer;
   c) a first polymer pattern over the second surface;
   d) a second polymer pattern over the second surface, the first polymer pattern and the second polymer pattern defining carrier collection contacts for the solar cell;
   e) a first conductive pattern electrically connecting the first polymer pattern over the second surface, and f) a second conductive pattern electrically connecting the second polymer pattern over the second surface.

20. The solar cell as defined by claim 19 and further including a dielectric polymer over the second surface and abutting the second polymer pattern.

21. The solar cell as defined by claim 20 wherein the second polymer pattern is spaced from the second surface by the second dielectric layer.

22. The solar cell as defined by claim 21 wherein the semiconductor body comprises silicon and the second dielectric layer comprises a layer of tunnel oxide.

23. The solar cell as defined by claim 20 wherein the second polymer pattern over the second surface contacts the second surface.

24. The solar cell as defined by claim 19 wherein the first polymer pattern has P type conductivity and the second polymer pattern comprises donor polymer.

25. The solar cell as defined by claim 19 wherein the first polymer pattern has N type conductivity and the second polymer pattern comprises acceptor polymer.

26. In a method of fabricating a solar cell, the steps of fabricating carrier accepting contacts comprising:
   a) providing an inorganic semiconductor substrate having first and second opposing major surfaces wherein the first surface is on a light-receiving side and the second surface is on a device side;
   b) forming a first carrier receiving polymer pattern over the second major surface by inkjet printing; and c) forming a second carrier generating polymer pattern over the second major surface by inkjet printing.

27. The method of claim 26, further including, prior to forming the first and second polymer patterns, the steps of:
   d) forming a tunneling dielectric layer on the second major surface; and
   e) forming a dielectric layer on the first major surface.

28. The method of claim 26, wherein the inorganic semiconductor substrate comprises a silicon substrate.

* * * * *